United States Patent
Choi et al.

(10) Patent No.: US 9,537,496 B2
(45) Date of Patent: Jan. 3, 2017

(54) METHOD FOR DRIVING SERDES CIRCUIT

(71) Applicant: Samsung Electronics Co., Ltd., Suwon-si, Gyeonggi-do (KR)

(72) Inventors: Hwang-Ho Choi, Saha-gu (KR); Jong-Shin Shin, Yongin-si (KR); Seung-Hee Yang, Hwaseong-si (KR); Chang-Kyung Seong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/712,261

(22) Filed: May 14, 2015

(65) Prior Publication Data
US 2016/0105273 A1 Apr. 14, 2016

(30) Foreign Application Priority Data

Oct. 13, 2014 (KR) ........................ 10-2014-0137506

(51) Int. Cl.
  H03D 3/24 (2006.01)
  H03L 7/18 (2006.01)
  H03M 9/00 (2006.01)
  H04L 1/00 (2006.01)

(52) U.S. Cl.
  CPC .................. *H03L 7/18* (2013.01); *H03M 9/00* (2013.01); *H04L 1/00* (2013.01)

(58) Field of Classification Search
  CPC ................. H04L 7/033; H04L 27/2273; H04L 2027/0057; H03L 7/0891
  USPC . 375/376, 371, 327, 375; 327/156; 455/127, 103, 307, 325
  See application file for complete search history.

(56) References Cited

U.S. PATENT DOCUMENTS

| | | | |
|---|---|---|---|
| 4,449,223 A | 5/1984 | Liskov et al. | |
| 6,587,530 B1 | 7/2003 | Conklin et al. | |
| 6,784,653 B2 | 8/2004 | Baumert | |
| 7,460,589 B2 | 12/2008 | Fujimori et al. | |
| 7,656,984 B2 | 2/2010 | Kim et al. | |
| 7,697,649 B2 | 4/2010 | Okamura | |
| 7,782,934 B2 | 8/2010 | Choi | |
| 7,787,536 B2 | 8/2010 | Chou | |
| 7,853,430 B2 | 12/2010 | Nakadaira | |
| 8,373,475 B2 | 2/2013 | Na et al. | |
| 8,443,243 B2 | 5/2013 | Matsumoto et al. | |
| 8,578,222 B2 | 11/2013 | Chun et al. | |
| 2010/0054386 A1* | 3/2010 | Abel .................... | H04J 3/0685 375/376 |

(Continued)

FOREIGN PATENT DOCUMENTS

| | | |
|---|---|---|
| JP | 2008-175646 A | 7/2008 |
| JP | 5174493 B2 | 4/2013 |

(Continued)

*Primary Examiner* — Khai Tran
(74) *Attorney, Agent, or Firm* — Harness, Dickey & Pierce, P.L.C.

(57) ABSTRACT

Provided is a method for driving a SERDES circuit, which may reduce waste of a space of the SERDES circuit. The circuit driving method includes generating a common clock signal from a common phase locked loop (PLL) supplying a clock signal to a serializer/deserializer (SERDES) circuit, distributing the common clock signal to an eye opening monitor and a data transmission lane in the SERDES circuit, and driving the eye opening monitor and the data transmission lane using the common clock signal.

18 Claims, 10 Drawing Sheets

(56) References Cited

U.S. PATENT DOCUMENTS

2012/0319749 A1* 12/2012 Thaller .................. H03L 7/183
327/158

FOREIGN PATENT DOCUMENTS

| KR | 10-0570632 B1 | 4/2006 |
| KR | 10-0795724 B1 | 1/2008 |

* cited by examiner

METHOD FOR DRIVING SERDES CIRCUIT

CROSS-REFERENCE TO RELATED APPLICATION

This application claims priority from Korean Patent Application No. 10-2014-0137506 filed on Oct. 13, 2014 in the Korean Intellectual Property Office, and all the benefits accruing therefrom under 35 U.S.C. 119, the contents of which in its entirety are herein incorporated by reference.

BACKGROUND

1. Field

Example embodiments of the inventive concepts relate to a method for driving a serializer/deserializer (SERDES) circuit and/or a circuit performing the same.

2. Description of the Related Art

In order to monitor waveforms of a particular point of a circuit, an eye opening monitor, e.g., an on-chip eye opening monitor may be used. A clock signal for driving the eye opening monitor should have a clock phase shifting resolution that is high enough to sample a waveform of a particular spot. In order to increase the clock phase shifting resolution for driving the eye opening monitor, dedicated additional circuit devices for shifting a phase of the clock signal may be additionally designed, which may, however, increase circuit sizes and may reduce the integration level of the circuit devices, thereby resulting in waste of a circuit space. Therefore, there is a need for proposing a method for driving the eye opening monitor with a high clock phase shifting resolution without installing an additional circuit device dedicated to the eye opening monitor.

SUMMARY

Some example embodiments of the inventive concepts provide a method for driving a SERDES circuit, which can reduce (or, alternatively, minimize) waste of a space of the SERDES circuit.

The above and other objects of the example embodiments of the inventive concepts will be described in or be apparent from the following description of some of the example embodiments.

Some example embodiments of the inventive concepts relate to a circuit driving method including generating a common clock signal from a common phase locked loop (PLL) supplying a clock signal to a serializer/deserializer (SERDES) circuit, distributing the common clock signal to an eye opening monitor and a data transmission lane in the SERDES circuit, and driving the eye opening monitor and the data transmission lane using the common clock signal.

Other example embodiments of the inventive concepts relate to a circuit driving method including generating a first clock signal from a common phase locked loop (PLL) supplying a clock signal to a serializer/deserializer (SERDES) circuit, generating a second clock signal having a higher clock phase shifting resolution than the first clock signal by shifting a phase of the first clock signal using a phase interpolator (PI) and a sigma-delta modulator (SDM) in the common PLL, and driving an eye opening monitor in the SERDES circuit using the second clock signal.

Other example embodiments of the inventive concepts relate to a circuit driving method including generating a clock signal for driving an eye opening monitor in a serializer/deserializer (SERDES), and driving a data transmission lane in the SERDES circuit using the clock signal for driving the eye opening monitor.

Other example embodiments relate to a method of driving a circuit.

In some example embodiments, the method includes generating, via a phase locked loop (PLL) circuit, a common clock signal based on a reference clock signal; and transmitting the common clock signal from the PLL circuit to an eye opening monitor and a data transmission lane of the circuit, the eye opening monitor configured to detect a height and a width of an eye diagram of a signal.

BRIEF DESCRIPTION OF THE DRAWINGS

The above and other features and advantages of the example embodiments of the inventive concepts will become more apparent by describing in detail preferred embodiments thereof with reference to the attached drawings in which.

DETAILED DESCRIPTION

Figure 1:
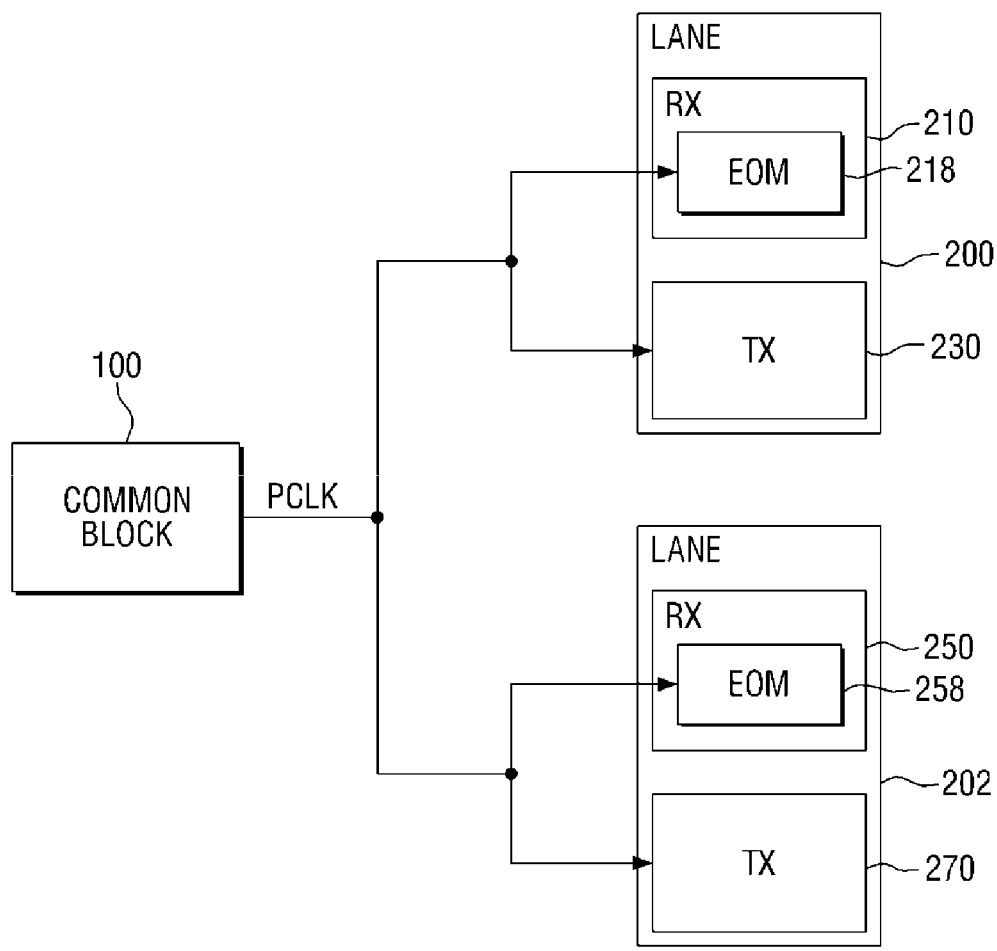
FIG. 1 is a block diagram for explaining a serializer/deserializer (SERDES) circuit according to an example embodiment of the inventive concepts.

Example embodiments will be described in detail with reference to the accompanying drawings. The example embodiments of the inventive concepts, however, may be embodied in various different forms, and should not be construed as being limited only to the illustrated example embodiments. Rather, these example embodiments are provided as examples so that this disclosure will be thorough and complete, and will fully convey the concept of the example embodiments of the inventive concepts to those skilled in the art. Accordingly, known processes, elements, and techniques are not described with respect to some of the example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular example embodiments only and is not intended to be limiting of the example embodiments of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, some example embodiments of the inventive concepts will be described with reference to the accompanying drawings.

FIG. 1 is a block diagram for explaining a serializer/deserializer (SERDES) circuit according to an example embodiment of the inventive concepts.

Referring to FIG. 1, the SERDES circuit according to an example embodiment of the inventive concepts include a common block 100 and one or more lanes 200 and 202.

The common block 100 may include circuit devices for generally controlling the SERDES circuit. For example, the common block 100 may include a bias generator, a phase locked loop (PLL) and various calibration devices.

The PLL provided in the common block 100 may generate a clock signal PCLK that is supplied to the entire region of the SERDES circuit. For example, the generated clock signal PCLK may be supplied not only to circuit devices disposed inside the common block 100 but also to circuit devices disposed outside the common block 100. For example, as illustrated in FIG. 1, lanes 200 and 202 are controlled using the clock signal PCLK generated in the common block 100.

The one or more lanes 200 and 202 are provided for transceiving data between the SERDES circuit and external circuits. In some example embodiments of the inventive concepts, lanes 200 and 202 may include data reception (RX) lanes 210 and 250 or data transmission (TX) lanes 230 and 270. Here, the data reception lanes 210 and 250 may receive serialized data from an external circuit and may reconstruct data by deserializing the serialized data. Meanwhile, the data transmission lanes 230 and 270 may serialize data and may then transmit the serialized data to an external circuit.

While the SERDES circuit shown in FIG. 1 includes 2 lanes 200 and 202, example embodiments of the inventive concepts are not limited thereto. For example, in some example embodiments of the inventive concepts, the SERDES circuit may include 3 or more lanes.

In some example embodiments of the inventive concepts, the data reception lanes 210 and 250 may include eye opening monitors (EOMs) 218 and 258, respectively. Each of the eye opening monitors includes devices for monitoring waveforms of a particular spot of the SERDES circuit. In detail, the eye opening monitors 218 and 258 may be driven by inputting a clock signal, may sample waveforms of a spot at which the eye opening monitors 218 and 258 are connected using the clock signal and may output the result (i.e., EOM_VALUE of FIG. 2).

While the eye opening monitors 218 and 258 shown in FIG. 1 are disposed in the data reception lanes 210 and 250, example embodiments of the inventive concepts are not limited thereto. For example, in some example embodiments of the inventive concepts, the eye opening monitors 218 and 258 may be disposed at different locations at which waveforms are desired to be monitored in the SERDES circuit including locations outside of the data reception lane 210.

In at least some example embodiments, as illustrated in FIG. 1, the clock signal PCLK generated from the common block 100 of the SERDES circuit may be commonly used in the eye opening monitors 218 and 258 and the data transmission lanes 230 and 270, which will be described in further detail with reference to FIG. 2.

Figure 2:
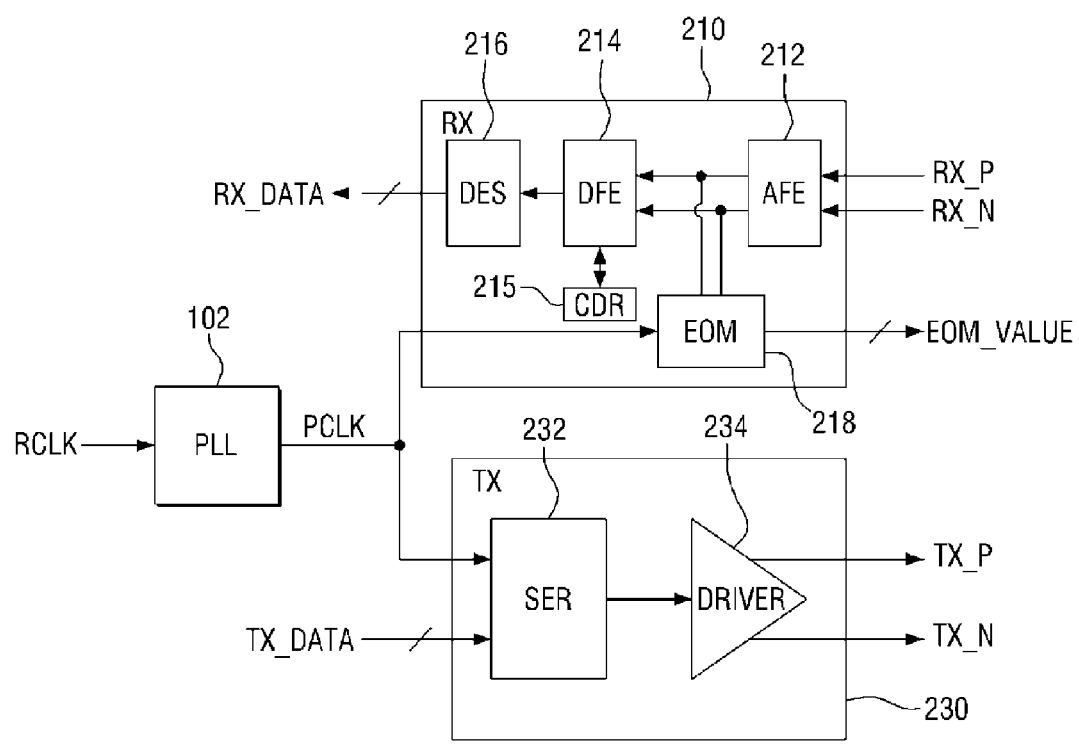
FIG. 2 is a block diagram for explaining a SERDES circuit according to an example embodiment of the inventive concepts.

FIG. 2 is a block diagram for explaining a SERDES circuit according to an example embodiment of the inventive concepts.

Referring to FIG. 2, the SERDES circuit according to an example embodiment of the inventive concepts includes a common PLL configured to generate a common clock signal PCLK having a shifted phase from a common PLL 102 supplying a reference clock signal RCLK to the SERDES circuit. The SERDES circuit may further include the data reception lane 210 and the data transmission lane 230.

In some example embodiments of the inventive concepts, the common PLL 102, as described above with reference to FIG. 1, may be included in the common block 100 of the SERDES circuit. Alternatively, in other example embodiments of the inventive concepts, the common PLL 102 may not be disposed inside the data reception lane 210 and the data transmission lane 230 but may be disposed outside the data reception lane 210 and the data transmission lane 230.

The common PLL 102 may distribute the common clock signal PCLK to the eye opening monitor 218 and the data transmission lane 230. Because the common clock signal PCLK is distributed to the eye opening monitor 281 and the data transmission lane 230, the eye opening monitor 218 and the data transmission lane 230 may share the common clock signal PCLK.

In some example embodiments of the inventive concepts, the data transmission lane 230 may include a serializer (SER) 232 and a driver 234. The data transmission lane 230 may convert transmission data TX_DATA into serialized transmission data TX_P and TX_N using the serializer 232 and the driver 234. In the present inventive concept, the common clock signal PCLK may be distributed to the eye opening monitor 281 and the serializer 232 of the data transmission lane 230.

Meanwhile, the data reception lane 210 may include an analog front end (AFE) 212, a decision feedback equalizer (DFE) 214, a clock and data recovery (CDR) 215 and a deserializer (DES) 216. The data reception lane 210 may convert serialized reception data RX_P and RX_N into deserialized reception data RX_DATA using the analog front end 212, the decision feedback equalizer 214, the clock and data recovery 215 and the deserializer 216.

While in FIG. 2, the eye opening monitor 218 is connected between the analog front end 212 and the decision feedback equalizer 214 in the data reception lane 210, example embodiments of the inventive concepts are not limited thereto. For example, the eye opening monitor 218 may be connected at any location at which waveforms are desired to be monitored in the SERDES circuit including locations the outside of the data reception lane 210.

In some example embodiments of the inventive concepts, the distributing of the common clock signal PCLK to the eye opening monitor 281 and the data transmission lane 230 may include directly transmitting the common clock signal PCLK generated from the common PLL 102 to the eye opening monitor 281. In other words, a clock signal output port of the common PLL 102 for outputting the common clock signal PCLK may be directly connected to a clock signal input port of the eye opening monitor 218 for receiving the common clock signal PCLK. Accordingly, a connection device for transmitting the clock signal, for example, devices other than wires, may not be provided between the clock signal output port of the common PLL 102 and the clock signal input port of the eye opening monitor 218.

The eye opening monitor 218 and the data transmission lane 230 (for example, the serializer 232 of the data transmission lane 230) may be driven using the common clock signal PCLK. In some example embodiments of the inventive concepts, the eye opening monitor 218 and the data transmission lane 230 may be driven at the same time using the distributed common clock signal PCLK.

According to an example embodiment of the inventive concepts, the eye opening monitor 218 and the data transmission lane 230 share the common clock signal PCLK generated by the common PLL 102, thereby, additional circuit devices for generating a separate clock signal for driving the eye opening monitor 218 may be omitted. Accordingly, an advantageous effect of reducing (or, alternatively, minimizing) waste of a circuit space is exerted.

Figure 3:
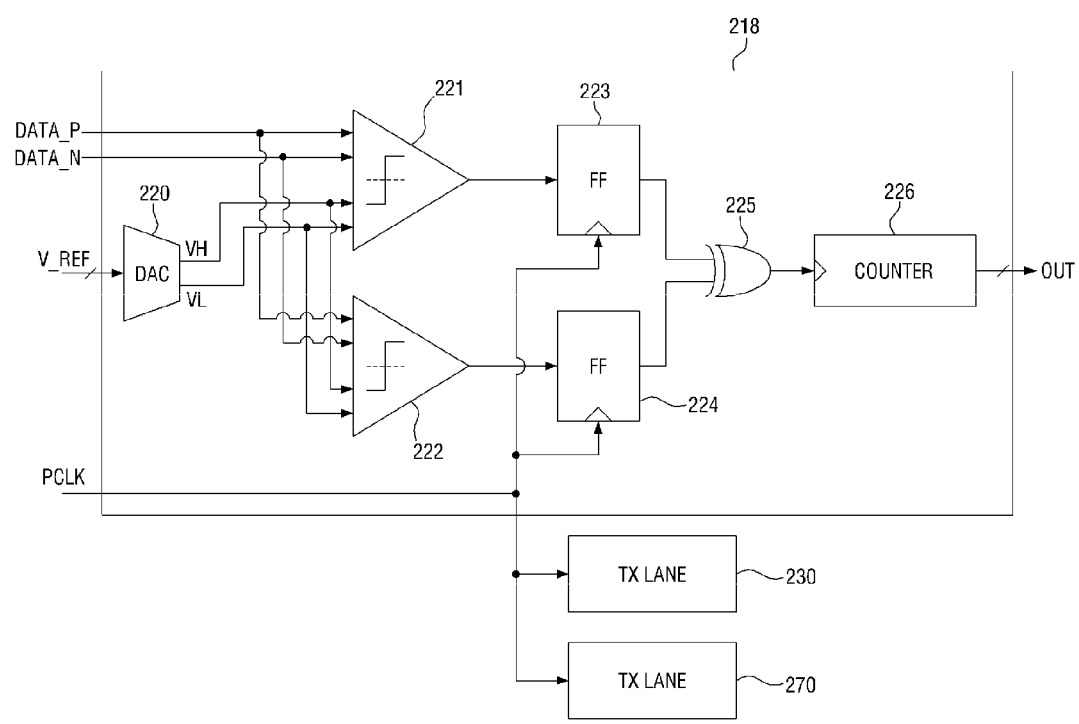
FIG. 3 is a block diagram for explaining a SERDES circuit according to another example embodiment of the inventive concepts.

FIG. 3 is a block diagram for explaining a SERDES circuit according to another example embodiment of the inventive concepts.

Referring to FIG. 3, the SERDES circuit may include two data transmission lanes 230 and 270 and an eye opening monitor 218, where the eye opening monitor 218 includes internal devices 220, 221, 222, 223, 224, 225 and 226.

The present example embodiment is different from the previous example embodiment shown in FIG. 2 in that a generation position of the clock signal PCLK for driving the eye opening monitor 218 is not particularly limited.

For example, in some example embodiments of the inventive concepts, the generation position of the clock signal PCLK may include a location in the SERDES circuit outside the common block 100. In some other example embodiments of the inventive concepts, the clock signal PCLK may be generated from the outside of the SERDES circuit to then be supplied to the eye opening monitor 218 and the data transmission lanes 230 and 270.

The data transmission lanes 230 and 270 in the SERDES circuit may use the clock signal PCLK generated from outside the common block 110 for driving the eye opening monitor 218.

In the present example embodiment of the inventive concepts, the eye opening monitor 218 may include one or more flip flops (FFs) 223 and 224. The one or more flip flops 223 and 224 may be driven using the clock signal PCLK for driving the eye opening monitor 218. The clock signal PCLK for driving the eye opening monitor 218 is also used in driving the data transmission lanes 230 and 270. Therefore, the one or more flip flops 223 and 224 of the eye opening monitor 218 and the data transmission lanes 230 and 270 may share the clock signal PCLK.

In some example embodiments of the inventive concepts, the SERDES circuit may further include other circuit devices different from the eye opening monitor 218 or the data transmission lanes 230 and 270 and may drive these other circuit devices using the clock signal PCLK for driving the eye opening monitor 218.

In some example embodiments of the inventive concepts, the generating of the clock signal PCLK for driving the eye opening monitor 218 may include generating a first clock signal having a first clock rate and generating a second clock signal having a higher clock phase shifting resolution than the first clock signal by shifting a phase of the first clock signal using a phase interpolator (PI) and a sigma-delta modulator (SDM) included in the SERDES circuit, which will later be described in more detail with reference to FIGS. 6 and 7.

Figure 4:
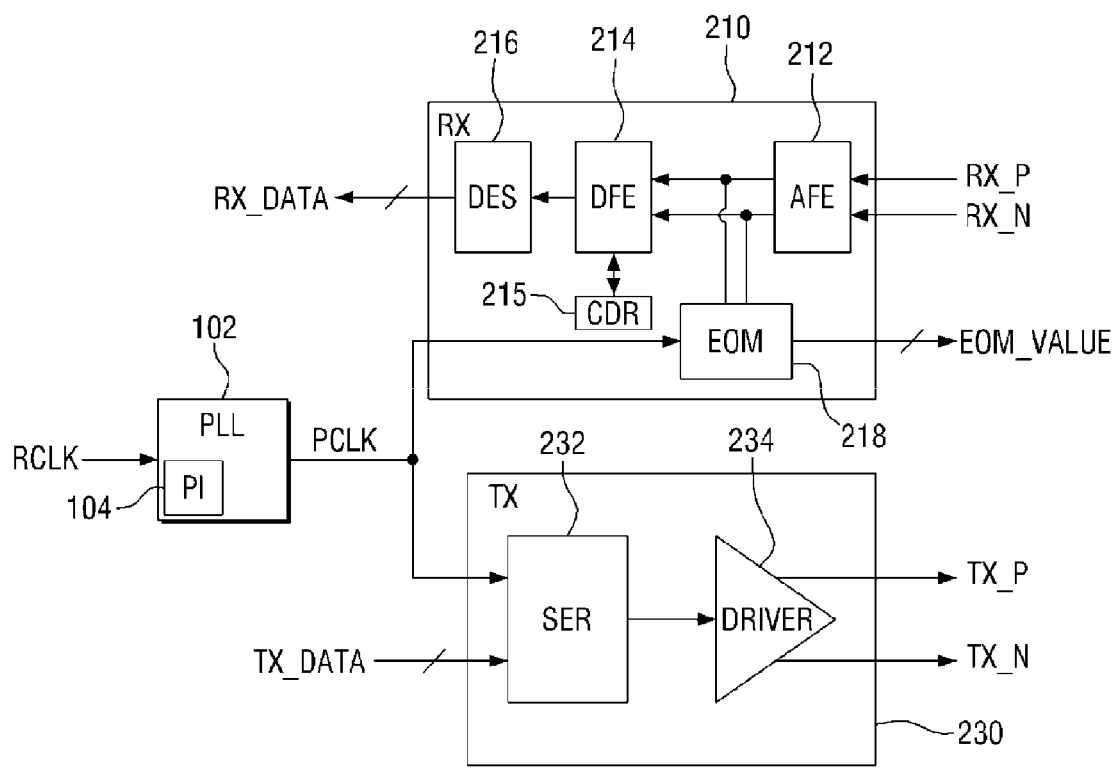
FIG. 4 is a block diagram for explaining a SERDES circuit according to still another example embodiment of the inventive concepts.

FIG. 4 is a block diagram for explaining a SERDES circuit according to still another example embodiment of the inventive concepts.

Referring to FIG. 4, the SERDES circuit according to still another example embodiment of the inventive concepts is different from the SERDES circuit shown in FIG. 2 in that a common PLL 102 includes a phase interpolator (PI) 104 and a phase of a common clock signal generated from the common PLL 102 is shifted using the PI 104.

In detail, in some embodiments of the present inventive concept, the PI 104 may receive a selection bit and may shift the phase of the common clock signal. Here, a phase shift resolution of the shifted clock signal may be a minimum phase step of the PI 104 itself. Therefore, the SERDES circuit may increase the phase resolution of a sampling clock of the eye opening monitor 218.

Figure 5:
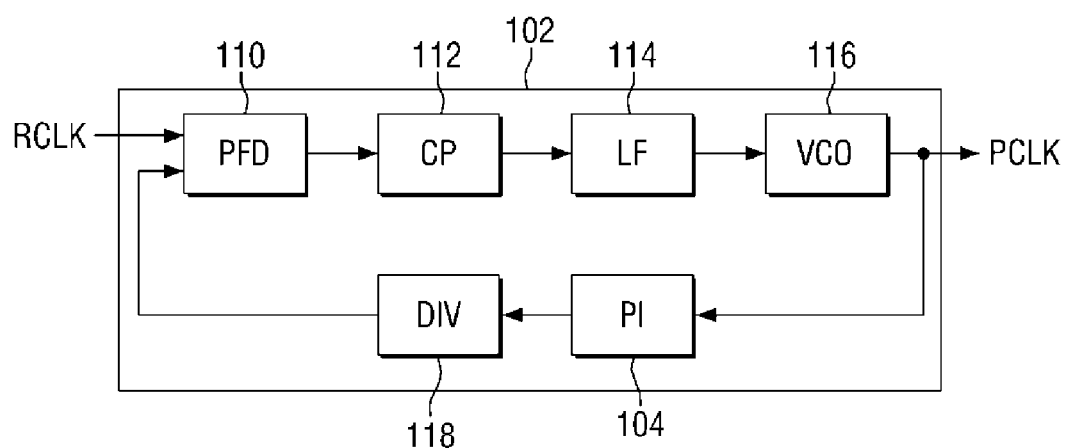
FIG. 5 is a block diagram for explaining a phase locked loop (PLL) of the SERDES circuit shown in FIG. 4.

FIG. 5 is a block diagram for explaining a phase locked loop (PLL) of the SERDES circuit shown in FIG. 4.

Referring to FIG. 5, the common PLL 102 may include a phase frequency detector (PFD) 110, a charge pump (CP) 112, a loop filter (LF) 114 and a voltage controlled oscillator (VCO) 116. The PFD 110, the CP 112, the LF 114, the VCO 116, and the PI 104 may be sequentially connected to form a PLL loop.

In some example embodiments the common PLL 102 may include a processor and a memory (not shown).

The memory may be any device capable of storing data including magnetic storage, flash storage, etc. The processor may be any device capable of processing data including, for example, a microprocessor configured to carry out specific operations by performing arithmetical, logical, and input/output operations based on input data, or capable of executing instructions included in computer readable code stored in the memory.

The processor may be a logic chip, for example, a central processing unit (CPU), a controller, or an application-specific integrated circuit (ASIC), that, when executing instructions stored in the memory, configures the common PLL 102 a special purpose computer configured to perform the operations of one or more of the PFD, the CP, the LF, the VCO, and the PI.

The common PLL 102 may generate a common clock signal PCLK from a reference clock RCLK for the first time as an output signal of the VCO 116 of the PLL loop and allowing the output signal of the VCO 116 to be fed back through the PLL loop from the PI 104 of the PLL loop, thereby shifting the phase of the common clock signal. Accordingly, the eye opening monitor 218 may receive the common clock signal PCLK having a high phase resolution from the common PLL.

In the SERDES circuit according to the present example embodiments, the eye opening monitor 218 and the data transmission lane 230 share the common clock signal PCLK generated by the common PLL 102, thereby there may not be any additional circuit devices for generating a separate clock signal for driving the eye opening monitor 218. In addition, since a phase shifting operation for providing a high phase resolution to the eye opening monitor 218 is performed using the PI 104 provided in the common PLL 102, it may not be necessary to additionally install a separate PI dedicated to the eye opening monitor 218. Accordingly, an advantageous effect of reducing (or, alternatively, minimizing) waste of a circuit space is exerted.

Figure 6:
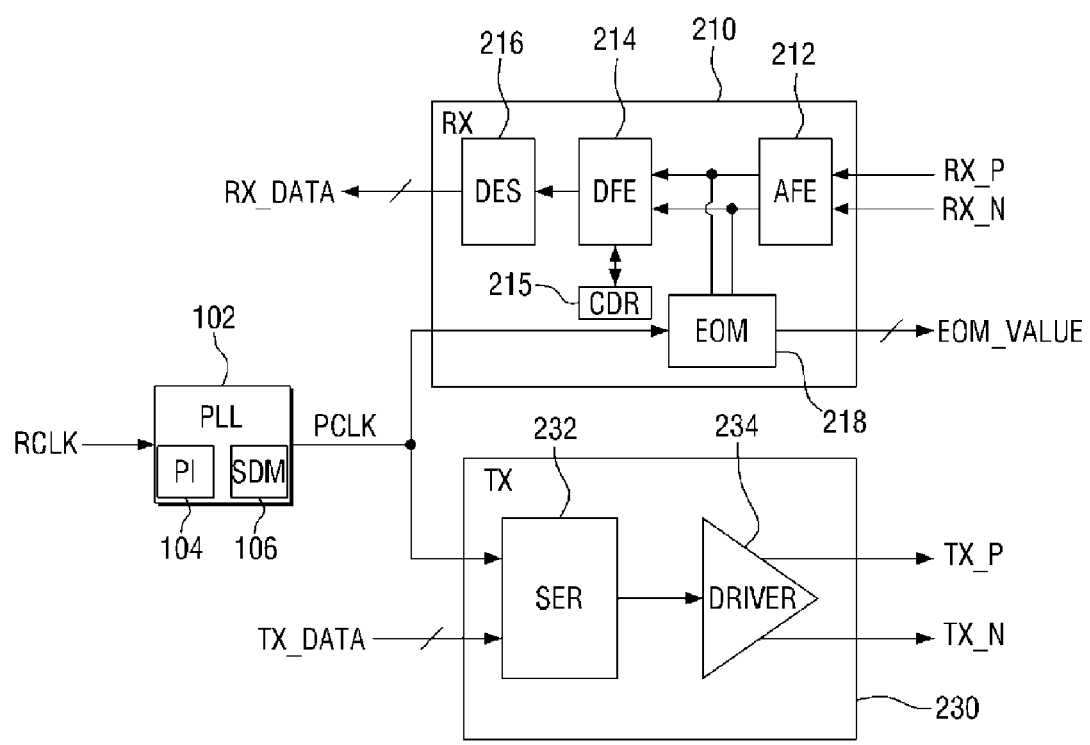
FIG. 6 is a block diagram for explaining a method for driving a SERDES circuit according to still another example embodiment of the inventive concepts.
Figure 7:
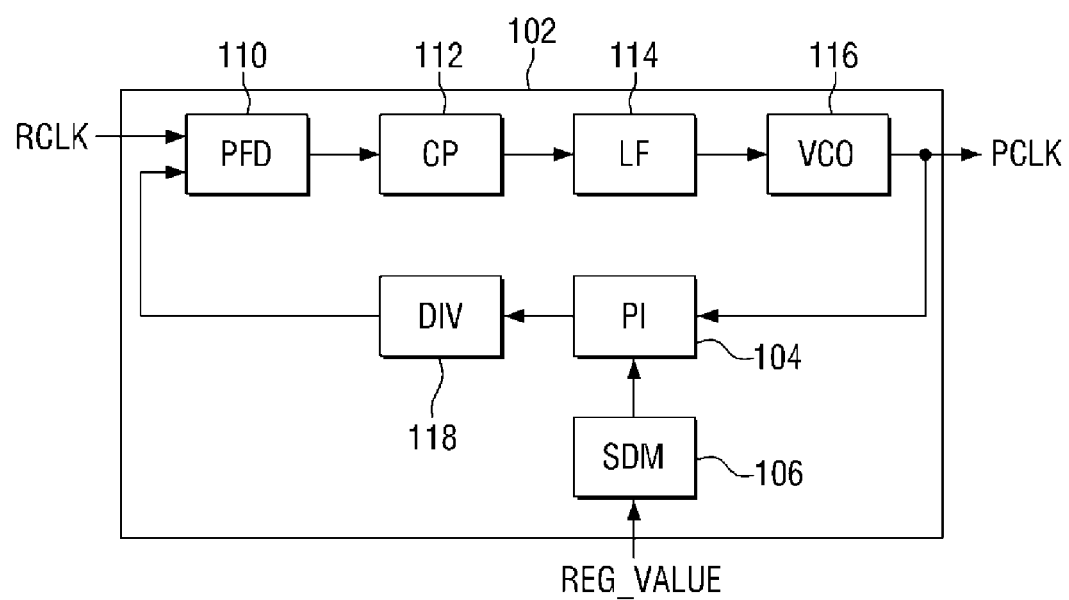
FIG. 7 is a block diagram for explaining a PLL of the SERDES circuit shown in FIG. 6.

FIG. 6 is a block diagram for explaining a method for driving a SERDES circuit according to still another example embodiment of the inventive concepts and FIG. 7 is a block diagram for explaining a PLL of the SERDES circuit shown in FIG. 6.

Referring to FIGS. 6 and 7, the SERDES circuit illustrated therein differs from the SERDES circuit shown in FIGS. 2 and 4 in that a common PLL 102 includes a phase interpolator (PI) 104 and a sigma-delta modulator (SDM) 106. The PI 104 and the SDM 106 may shift a phase of a common clock signal generated from the common PLL 102. In detail, in some example embodiments of the present inventive concepts, the PI 104 may receive a selection bit signal and may shift the phase of the common clock signal, which is the same as described above. However, in the present example embodiment, the selection bit signal input to the PI 104 is dithered using the SDM 106, for example, to intentionally apply noise to randomize quantization error. The extent of dithering the selection bit signal input to the PI 104 may be adjusted by controlling the SDM 106 by inputting a signal having a particular value (REG_VALUE) to the SDM 106.

If the selection bit signal input to the PI 104 is dithered, the PI 104 outputs two signals having an adjacent phase relationship, that is, a first phase signal and a second phase signal. Here, the first phase signal and the second phase signal are alternately output from the PI 104 and may include some of jitter components. Since the signals including jitter components do not have a constant phase, the first phase signal and the second phase signal output from the PI 104 are fed back in a PLL loop to a PFD 110, to acquire a signal having a constant phase. The first phase signal and the second phase signal having passed through the PLL loop are output from the common PLL 102 as a third phase signal having a constant phase and a high clock phase shifting resolution.

Here, the phase shift resolution of the shifted clock signal may be obtained by dividing a minimum phase step of the PI 104 itself by a resolution of the SDM 106. Therefore, the phase resolution of a sampling clock of the eye opening monitor 218 can be noticeably increased.

In example embodiments, the eye opening monitor 218 and the data transmission lane 230 share the common clock signal PCLK generated by the common PLL 102, thereby additionally designing circuit devices for generating a separate clock signal for driving the eye opening monitor 218 may not be necessary. In addition, since a phase shifting operation for providing a high phase resolution to the eye opening monitor 218 is performed using the PI 104 and the SDM 106 provided in the common PLL 102, it may not be necessary to additionally install a separate PI or SDM dedicated to the eye opening monitor 218. Accordingly, an advantageous effect of reducing (or, alternatively, minimizing) waste of a circuit space is exerted.

Figure 8:
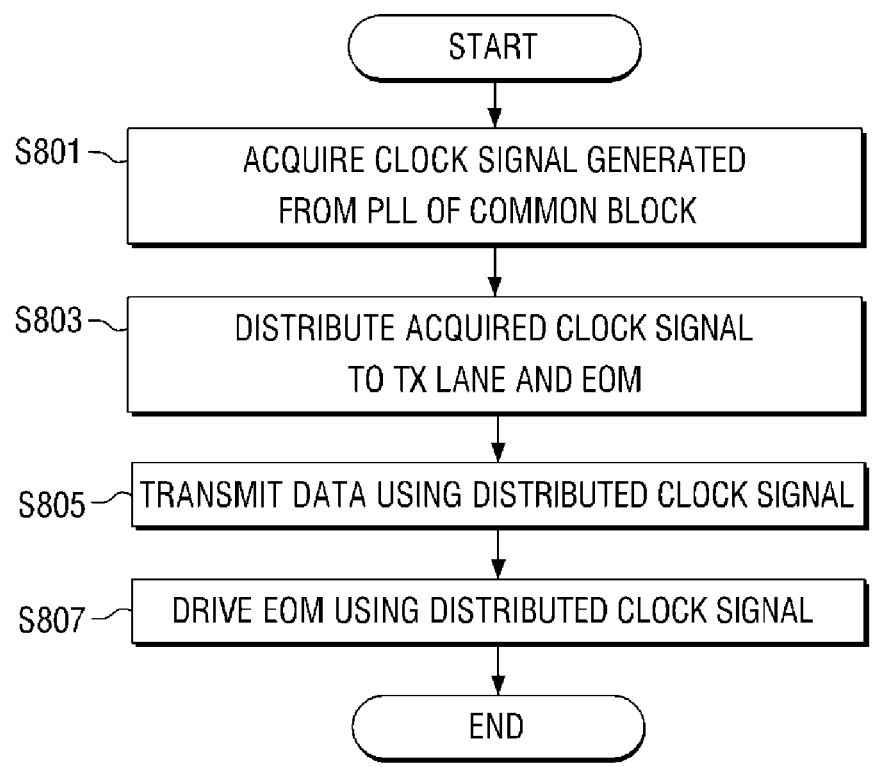
FIG. 8 is a flowchart for explaining a method for driving a SERDES circuit according to an example embodiment of the inventive concepts.

FIG. 8 is a flowchart for explaining a method for driving a SERDES circuit according to an example embodiment of the inventive concepts.

Referring to FIG. 8, in operation S801, the clock signal PCLK generated from the PLL 102 of the common block 100 of the SERDES circuit is acquired.

In operation S803, the acquired clock signal PCLK is distributed to the eye opening monitor 218 and the data transmission lane 230.

In operation S805, the data transmission lane 230 serializes data using the distributed clock signal PCLK and then transmits the serialized data.

In operation S807, the distributed clock signal PCLK is also used in driving the eye opening monitor 218. In detail, the eye opening monitor 218, samples a signal of a particular spot using the distributed clock signal PCLK and outputs the sampling result.

Figure 9:
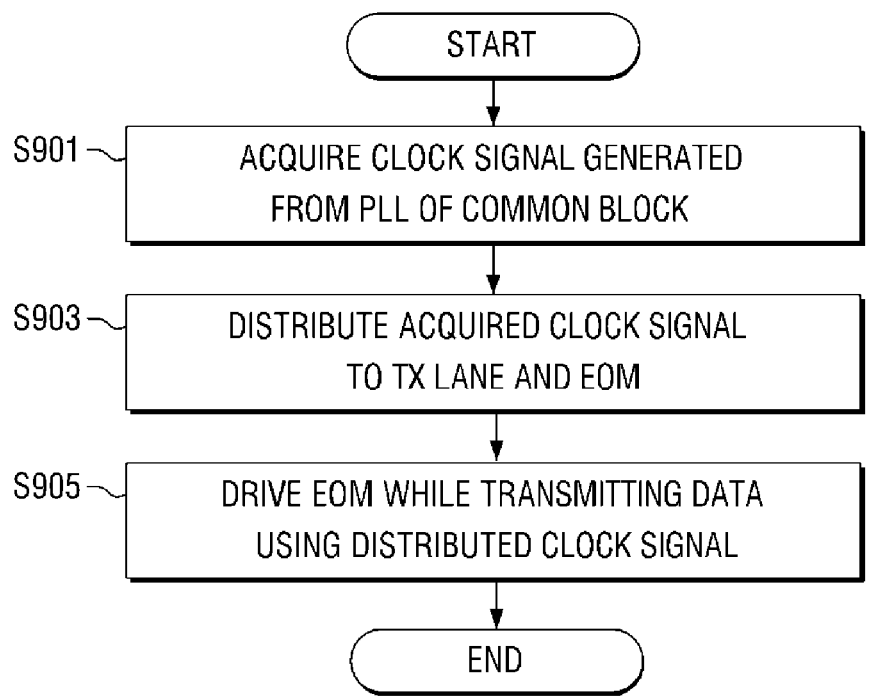
FIG. 9 is a flowchart for explaining a method for driving a SERDES circuit according to another example embodiment of the inventive concepts.

FIG. 9 is a flowchart for explaining a method for driving a SERDES circuit according to another example embodiment of the inventive concepts.

Referring to FIG. 9, in operation S901, the clock signal PCLK generated from the PLL 102 of the common block 100 of the SERDES circuit is acquired.

In operation S903, the acquired clock signal PCLK is distributed to the eye opening monitor 218 and the data transmission lane 230.

In operation S905, the distributed clock signal PCLK is used to drive the data transmission lane 230 and the eye opening monitor 218 at the same time, for example, to drive the eye opening monitor 218 while driving the data transmission lane 230. In detail, while the data transmission lane 230 serializes data using the distributed clock signal PCLK and transmits serialized data, the eye opening monitor 218 samples the signal of a particular spot using the distributed clock signal PCLK and outputs the sampling result.

Figure 10:
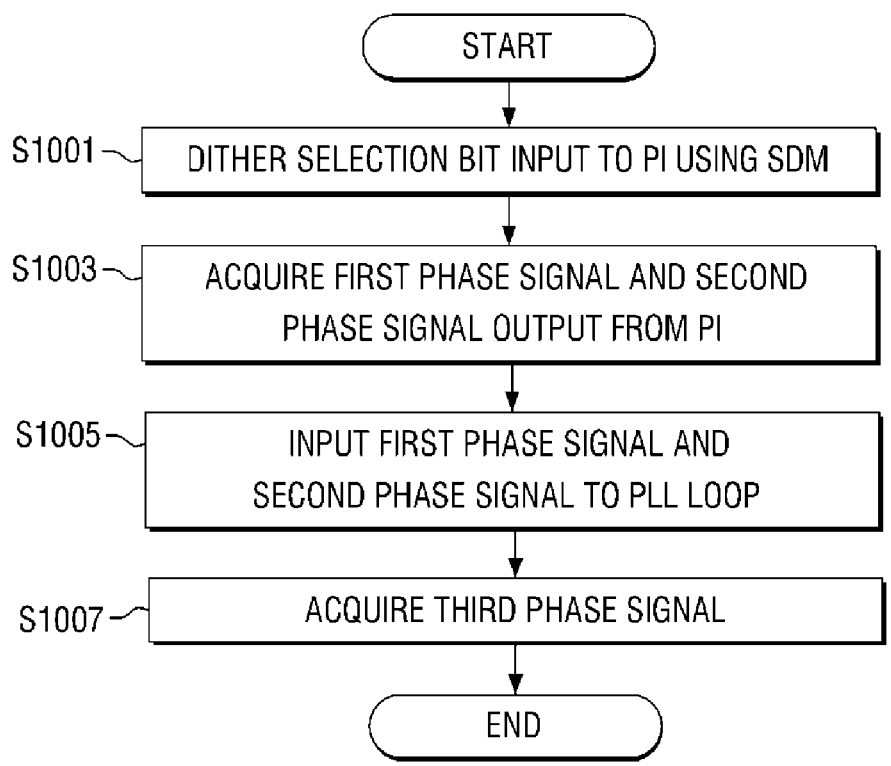
FIG. 10 is a flowchart for explaining a method for driving a SERDES circuit according to still another example embodiment of the inventive concepts.

FIG. 10 is a flowchart for explaining a method for driving a SERDES circuit according to still another example embodiment of the inventive concepts.

Referring to FIG. 10, in operation S1001, a selection bit signal input to a phase interpolator (PI) 104 is dithered using a sigma-delta modulator (SDM) 106. In the present inventive concept, a common PLL 102 includes the PI 104 and the SDM 106.

In operation S1003, a first phase signal and a second phase signal output from the PI 104 are acquired.

Thereafter, in order to offset jitter components, in operation S1005, the first phase signal and the second phase signal output from the PI 104 are input to a PLL loop.

In operation S1007, the first phase signal and the second phase signal having passed through the PLL loop are eventually output from the common PLL 102 as a third phase signal having a constant phase and a high clock phase shifting resolution, and the third phase signal is acquired to be used as a common clock signal PCLK.

While example embodiments of the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the example embodiments be considered in all respects as illustrative and not restrictive, reference being made to the appended claims rather than the foregoing description to indicate the scope of the example embodiments of the inventive concepts.

What is claimed is:

1. A circuit driving method comprising:
generating, via a common phase locked loop (PLL), a common clock signal to supply to a serializer/deserializer (SERDES) circuit;
distributing the common clock signal to an eye opening monitor and a data transmission lane of the SERDES circuit; and
driving the eye opening monitor and the data transmission lane at a same time using the common clock signal.

2. The circuit driving method of claim 1, wherein the distributing comprises:
directly transmitting the common clock signal generated from the common PLL to the eye opening monitor.

3. The circuit driving method of claim 2, wherein
the common PLL includes a clock signal output port and the eye opening monitor includes a clock signal input port, and
the directly transmitting includes transmitting the common clock signal from the clock signal output port directly to the clock signal input port.

4. The circuit driving method of claim 1, wherein the eye opening monitor and the data transmission lane share the common clock signal.

5. The circuit driving method of claim 1, wherein
the common PLL is included in a common block, and
the eye opening monitor and the data transmission lane are disposed outside the common block in the SERDES circuit.

6. The circuit driving method of claim 5, wherein the eye opening monitor is associated with a data reception lane outside the common block.

7. The circuit driving method of claim 1, wherein the common PLL includes a phase interpolator (PI), and the generating further comprises:
shifting, via the PI, a phase of the common clock signal generated from the common PLL.

8. The circuit driving method of claim 1, wherein the common PLL includes a phase interpolator (PI) and a sigma-delta modulator (SDM) and the generating further comprises:
shifting, via the PI and the SDM, a phase of the common clock signal generated from the common PLL.

9. The circuit driving method of claim 8, wherein the shifting comprises:
dithering, via the SDM, a selection bit signal input to the PI;
acquiring, via the PI, a first phase signal and a second phase signal; and
acquiring a third phase signal by inputting the first phase signal and the second phase signal to a PLL loop within the common PLL.

10. The circuit driving method of claim 9, wherein
the common PLL includes a phase frequency detector (PFD), a charge pump (CP), a loop filter (LF) and a voltage controlled oscillator (VCO),
the PLL loop is a loop formed by sequentially connecting the PFD, the CP, the LF, the VCO, and the PI, and
the first phase signal and the second phase signal are input to the PFD and the third phase signal is output from the VCO.

11. A circuit driving method comprising:
generating, via a common phase locked loop (PLL), a first clock signal to supply to a serializer/deserializer (SERDES) circuit;
generating, via a phase interpolator (PI) and a sigma-delta modulator (SDM) associated with the common PLL, a second clock signal having a higher clock phase shifting resolution than the first clock signal by shifting a phase of the first clock signal; and
driving an eye opening monitor associated with the SERDES circuit using the second clock signal.

12. The circuit driving method of claim 11, wherein a clock signal output port of the common PLL for outputting the second clock signal is directly connected to a clock signal input port of the eye opening monitor for receiving the second clock signal.

13. The circuit driving method of claim 11, wherein the eye opening monitor includes one or more flip flops, and the driving comprises:
driving the one or more flip flops of the eye opening monitor using the second clock signal.

14. The circuit driving method of claim 11, wherein the SERDES circuit includes one or more data transmission lanes and the circuit driving method further comprises:
driving the one or more data transmission lanes using the second clock signal.

15. A method of driving a circuit, the method comprising:
generating, via a phase locked loop (PLL) circuit, a common clock signal based on a reference clock signal; and
transmitting the common clock signal from the PLL circuit to an eye opening monitor and a data transmission lane of the circuit, the eye opening monitor configured to detect a height and a width of an eye diagram of a signal,
wherein the eve opening monitor and the data transmission lane are driven at a same time using the common clock signal.

16. The method of claim 15, wherein the circuit is a serializer/deserializer (SERDES) circuit.

17. The method of claim 15, wherein
the PLL circuit includes a clock signal output port and the eye opening monitor includes a clock signal input port, and
the transmitting includes transmitting the common clock signal from the clock signal output port directly to the clock signal input port.

18. The method of claim 15, wherein the PLL circuit includes a phase interpolator (PI), and the generating further comprises:
shifting, via the PI, a phase of the common clock signal.

* * * * *